(12) United States Patent
Nguyen et al.

(10) Patent No.: US 12,206,325 B2
(45) Date of Patent: Jan. 21, 2025

(54) PUMPING CONTROLLER FOR A PLURALITY OF CHARGE PUMP UNITS

(71) Applicant: Silicon Storage Technology, Inc., San Jose, CA (US)

(72) Inventors: Thoan Nguyen, Dong Nai (VN); Nghia Nguyen, Ho Chi Minh (VN); Viet Nguyen, Ho Chi Minh (VN); Son Nguyen, Ho Chi Minh (VN); Hien Lai, Ho Chi Minh (VN); Phuong Nguyen, Ho Chi Minh (VN)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 18/135,395

(22) Filed: Apr. 17, 2023

(65) Prior Publication Data

US 2024/0266955 A1    Aug. 8, 2024

Related U.S. Application Data

(60) Provisional application No. 63/442,807, filed on Feb. 2, 2023.

(51) Int. Cl.
    *H02M 3/07*    (2006.01)
(52) U.S. Cl.
    CPC .................................. *H02M 3/077* (2021.05)
(58) Field of Classification Search
    None
    See application file for complete search history.

(56) References Cited

U.S. PATENT DOCUMENTS

| | | | | |
|---|---|---|---|---|
| 5,180,928 A * | 1/1993 | Choi | ....................... | G05F 3/205 327/541 |
| 5,191,232 A * | 3/1993 | Wang | .................... | H02M 3/073 327/306 |
| 5,650,671 A * | 7/1997 | Pascucci | .................. | H02M 3/07 327/306 |
| 5,760,497 A * | 6/1998 | Pascucci | ................... | G05F 3/24 327/306 |
| 6,816,000 B2 * | 11/2004 | Miyamitsu | ............ | H02M 3/073 327/536 |
| 6,838,928 B2 * | 1/2005 | Mihara | ................. | H02M 3/073 327/536 |
| 8,462,578 B2 | 6/2013 | Neto et al. | | |

(Continued)

FOREIGN PATENT DOCUMENTS

CN          114 421 760          4/2022

OTHER PUBLICATIONS

PCT Search Report and Written Opinion mailed on Oct. 17, 2023 corresponding to the related PCT Patent Application No. PCT/US2023/019748.

*Primary Examiner* — Jeffrey S Zweizig
(74) *Attorney, Agent, or Firm* — DLA PIPER LLP US

(57) ABSTRACT

In one example, a system comprises a plurality of charge pump units connected in parallel to receive an input voltage and to generate an output voltage greater than the input voltage and a pumping controller to provide a pumping signal to a first charge pump unit of the plurality of charge pump units and to provide sequentially delayed versions of the pumping signal to the other charge pump units of the plurality of charge pump units.

16 Claims, 4 Drawing Sheets

(56) References Cited

U.S. PATENT DOCUMENTS

| | | | | |
|---|---|---|---|---|
| 8,493,134 B2* | 7/2013 | Hao | ............... | G06F 1/06 |
| | | | | 327/536 |
| 9,491,151 B2* | 11/2016 | Shao | ............... | H03K 5/159 |
| 2009/0285038 A1 | 11/2009 | Cornwell | | |
| 2023/0006549 A1 | 1/2023 | Liu et al. | | |

* cited by examiner

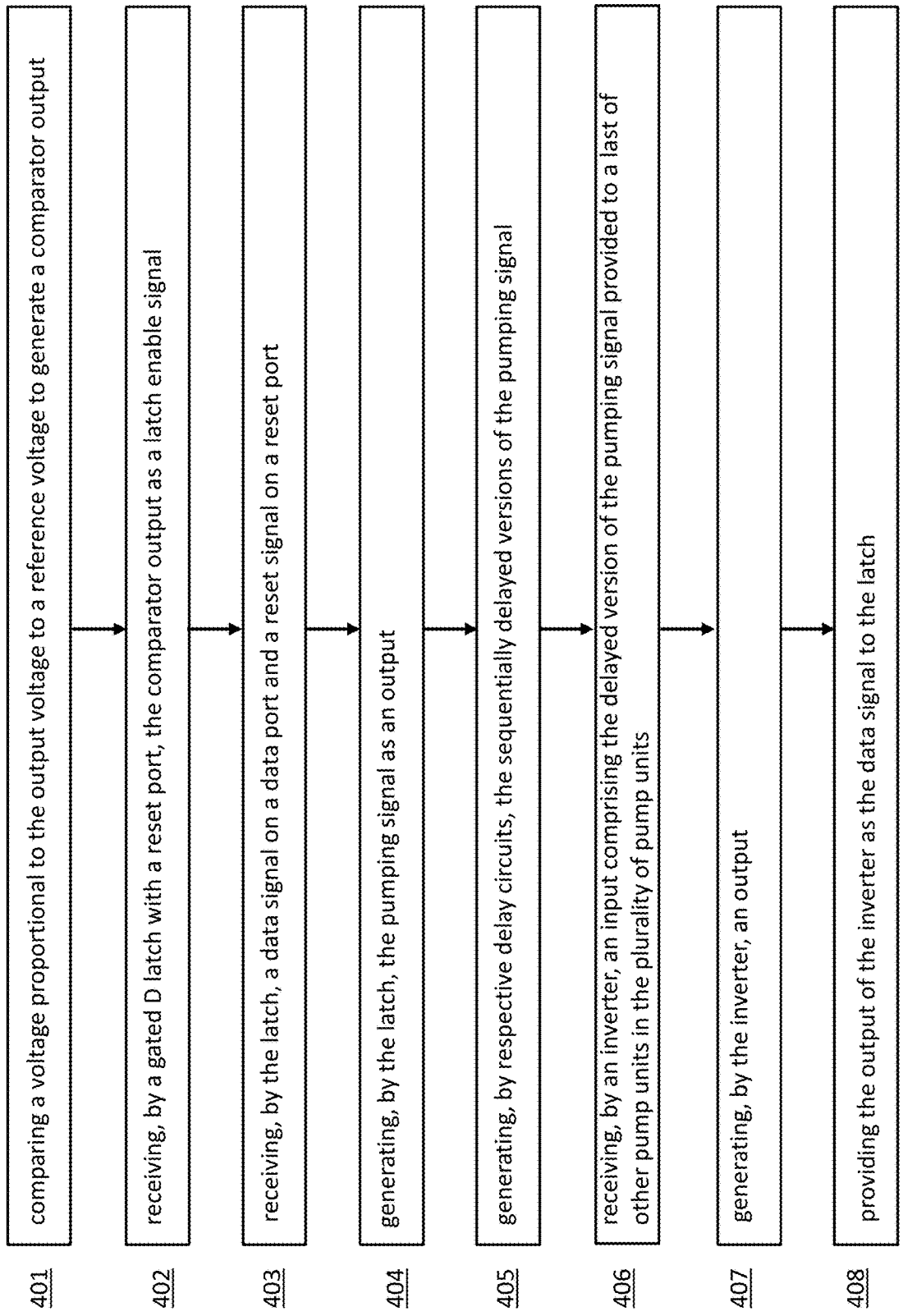

PUMPING CONTROLLER FOR A PLURALITY OF CHARGE PUMP UNITS

PRIORITY CLAIM

This application claims priority from U.S. Provisional Patent Application No. 63/442,807, filed on Feb. 2, 2023, and titled, "Charge Pump Comprising Latch-Based Self-Oscillating Voltage Regulator," which is incorporated by reference herein.

FIELD OF THE INVENTION

A pumping controller to provide pumping signals to a plurality of charge pump units is disclosed.

BACKGROUND OF THE INVENTION

Charge pumps are commonly used in semiconductor devices to generate voltages greater than the available supply voltage, the available supply voltage commonly denoted as VDD. For example, charge pumps are used in flash memory systems to generate voltages greater than VDD for program, erase, or read operations.

The prior art includes designs with multiple charge pump units operating in parallel. One limitation of these prior art designs is that because each charge pump unit starts its the charge and discharge operation at the same time according to a common pumping signal, resulting in a power surge at the beginning of each charging cycle, which can harm circuits that are sensitive to surges in current or voltage. Another drawback of prior art designs is that if the charge pump reaches a desired voltage level, the charging operation sometimes will continue for a period of time before it is stopped, which results in the output going higher than the desired level.

What is needed is an improved charge pump design and control system.

SUMMARY OF THE INVENTION

A pumping controller for a plurality of charge pumps is disclosed.

BRIEF DESCRIPTION OF THE DRAWINGS

FIGS. 3 and 4 depict a method of operation of the voltage regulator of FIG. 1.

DETAILED DESCRIPTION OF THE INVENTION

Figure 1:
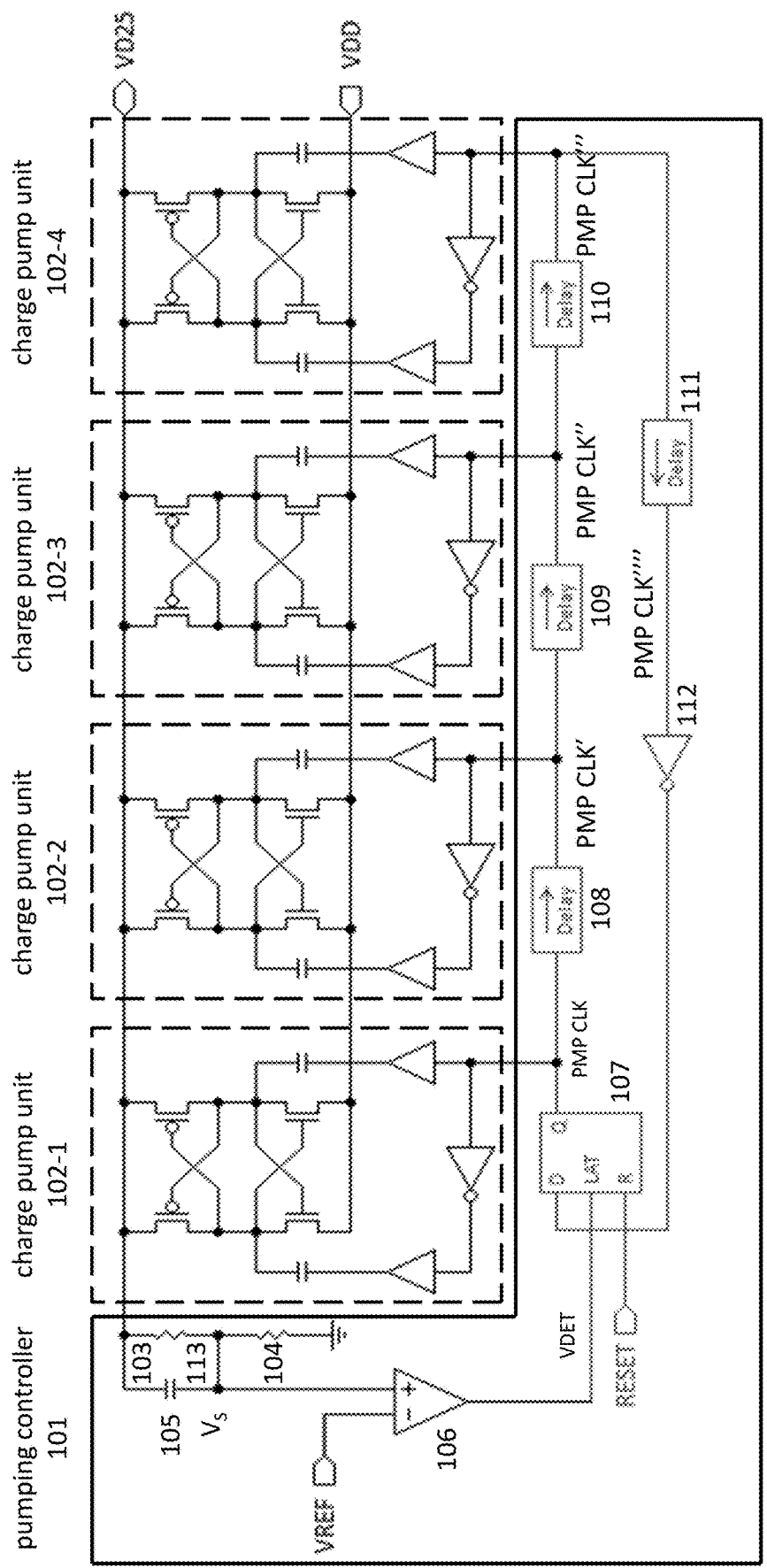
FIG. 1 depicts a voltage regulator comprising a pumping controller and a plurality of charge pump units.

FIG. 1 depicts a system comprising voltage regulator 100. Voltage regulator 100 comprises charge pump units 102-1, 102-2, 102-3, and 102-4. Charge pump units 102-1, 102-2, 102-3, and 102-4 are connected in parallel and each receives an input voltage, VDD, and generates an output voltage, VD25, that is larger than the input voltage. In this example, four charge pump units are connected in parallel to provide output voltage VD25 so as to be able to power an attached load without drooping.

Voltage regulator 100 further comprises pumping controller 101. Pumping controller 101 comprises a voltage divider comprising a first resistor 103 and a second resistor 104, which produces at node 113 a divided voltage, $V_S$, which is proportional to output voltage VD25. Comparator 106 receives divided voltage $V_S$ on a first, non-inverting input and a reference voltage, VREF, on a second, inverting input and compares them. When $V_S$>VREF, the output, VDET, of comparator 106 is high, and when $V_S$<VREF, the output of comparator 106 is low. Capacitor 105 transfers ripples from VD25 to $V_S$ to speed up comparator 106.

Latch 107 is a gated D latch with a reset signal, that performs according to the following truth table:

| R | D | LAT | Q |
|---|---|-----|---|
| 1 | 0/1 | 0/1 | 0 |
| 0 | 0/1 | 0 | D |
| 0 | 0/1 | 1 | Q |

The signal RESET is provided on the reset port, R, of latch 107, by other logic or a controller that is not shown. A latch enable port, LAT, of latch 107, receives the signal VDET from comparator 106. A data port, D, of latch 107, receives a signal from inverter 112, described in more detail below. As shown in the above truth table, when the RESET signal on the reset port, R, is asserted, the output, Q, is 0 regardless of the values received by the data port, D, and the latch enable port, LAT. When the RESET signal on the reset port, R, is not asserted and signal received by the latch enable port, LAT, is asserted (which will occur when $V_S$>VREF, signifying that VD25 has reached, or exceeded, the desired voltage), the output, Q, will hold its level regardless of the value received subsequently by the data port, D. When the RESET signal on the R port is not asserted and the signal received by the latch enable port, LAT, is not asserted (which will occur when $V_S$<VREF, signifying that VD25 is less than the desired voltage and additional pumping is desirable), the output, Q, will be whatever is received by the data port, D, at the time.

The output, Q, is the signal PMP CLK, which is provided as a pumping signal to charge pump unit 102-1 and to an input of delay circuit 108. Delay circuit 108 passes through its received signal, PMP CLK, but with an added delay to generate signal PMP CLK' at the output of delay circuit 108.

PMP CLK' is provided as a pumping signal to charge pump unit 102-2 and to an input of delay circuit 109. Delay circuit 109 passes through its received signal, PMP CLK', but with an added delay to generate signal PMP CLK" at the output of delay circuit 109.

PMP CLK" is provided as a pumping signal to charge pump unit 102-3 and an input of delay circuit 110. Delay circuit 110 passes through its received signal, PMP CLK", but with an added delay to generate signal PMP CLK''' at the output of delay circuit 110.

PMP CLK''' is provided as a pumping signal to charge pump unit 102-4 and an input of delay circuit 111. Delay circuit 111 passes through its received signal, PMP CLK''', but with an added delay to generate signal PMP CLK'''' at the output of delay circuit 111. In this example, charge pump unit 102-4 is the last pump unit in the plurality of pump units 102.

Inverter 112 receives signal PMP CLK'''' and generates the inverse of PMP CLK'''', which is then provided as the data signal at the data port, D, of latch 107.

The end result is that pumping controller generates an oscillating signal (PMP CLK) when RESET is low and VDET is low and generates sequentially delayed versions of that oscillating signal (PMP CLK' PMP CLK", PMP CLK'", and PMP CLK""). When VDET goes high, PMP CLK remains steady at its existing value and the oscillation of the oscillating signal (PMP CLK), and the sequentially delayed versions of that oscillating signal (PMP CLK' PMP CLK", PMP CLK'", and PMP CLK""), stops.

Thus, it can be understood that voltage regulator 100 comprises a plurality of charge pump units 102 for receiving an input voltage (VDD) and generating an output voltage (VD25) greater than the input voltage, and a pumping controller 101 for providing a pumping signal (PMP CLK) to a first pump unit of the plurality of pump units (e.g., pump unit 102-1) and providing respective sequentially delayed versions of the pumping signal (PMP CLK', PMP CLK", and PMP CLK'") to the other pump units in the plurality of pump units (e.g., pump units 102-2, 102-3, and 102-4).

Although voltage regulator 100 in this example contains four pump units 102, it is to be understood that voltage regulator 100 alternatively could include fewer than four pump units 102 or more than four pump units 102.

Figure 2:
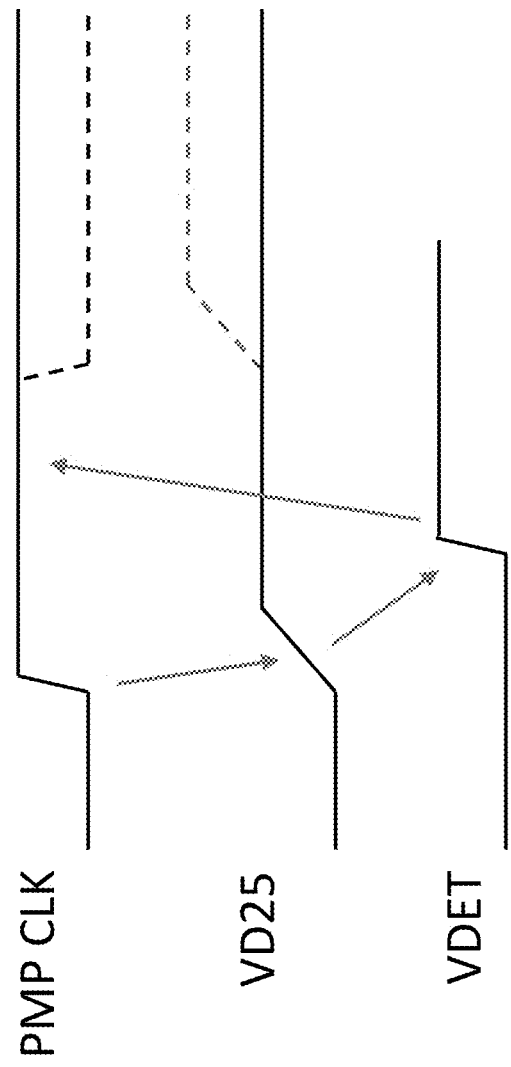
FIG. 2 depicts timing diagrams for the voltage regulator of FIG. 1.

FIG. 2 depicts timing diagram 200 for voltage regulator 100 and shows signals PMP CLK, VD25, and VDET. Unlike in certain prior art systems, the output voltage VD25 does not experience an additional charging cycle that causes the output voltage to go higher than desired (in contrast to the dotted line shown for VD25, which indicates how VD25 might experience an additional voltage boost in certain prior art systems), which is due to VDET being used as the LAT input to latch 107. That is, when VDET goes high, the output of latch 107, PMP CLK, will remain in its present state and will stop oscillating (in contrast to the dotted line shown for PMP CLK, which indicates how PMP CLK might behave in certain prior art systems).

Figure 3:
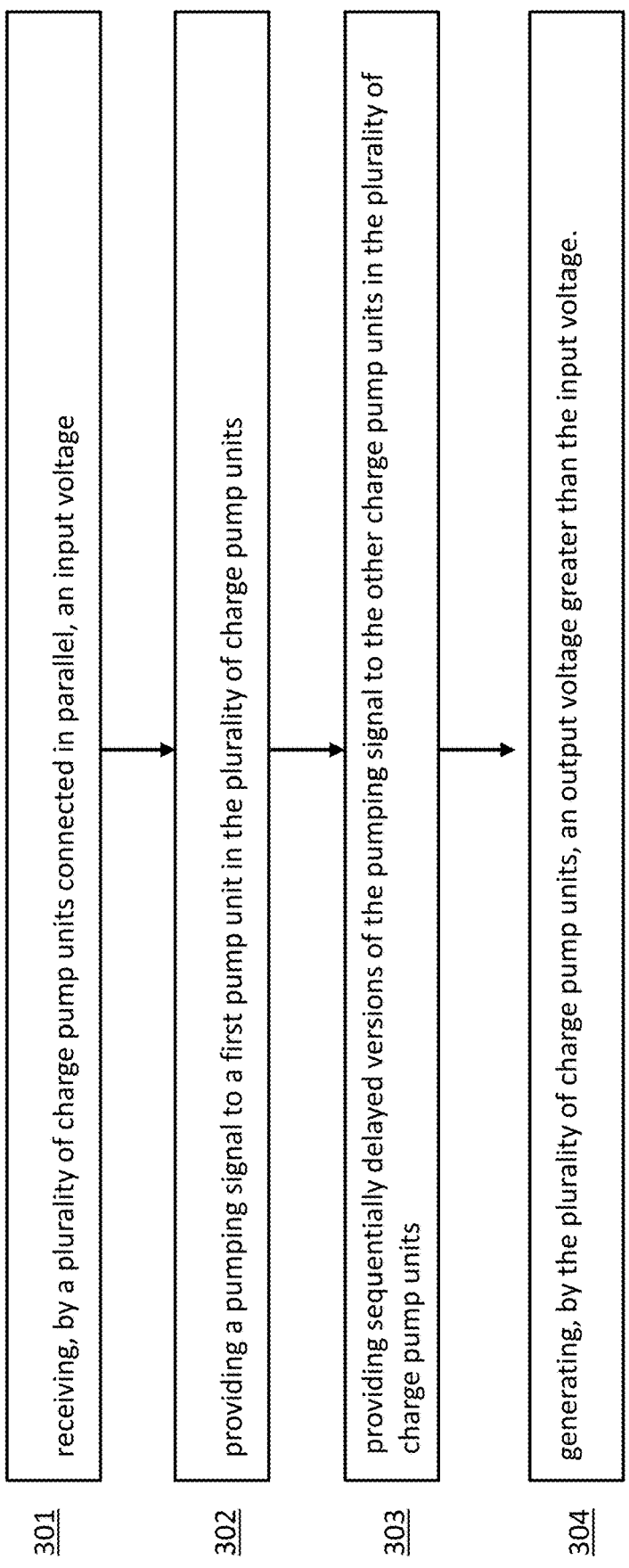

FIG. 3 depicts a method 300 of operation of voltage regulator 100 of FIGS. 1 and 2. Method 300 comprises receiving, by a plurality of charge pump units connected in parallel, an input voltage (301); providing a pumping signal to a first pump unit in the plurality of charge pump units (302); providing sequentially delayed versions of the pumping signal to the other charge pump units in the plurality of charge pump units (303); and (304) generating, by the plurality of charge pump units, an output voltage greater than the input voltage.

FIG. 4 depicts a method 400. Method 400 is an example of a method to perform providing a pumping signal to a first pump unit in the plurality of charge pump units (302) and providing sequentially delayed versions of the pumping signal to the other charge pump units in the plurality of charge pump units (303) in method 300. Method 400 comprises comparing a voltage proportional to the output voltage to a reference voltage to generate a comparator output (401); receiving, by a gated D latch with a reset port, the comparator output as a latch enable signal (402); receiving, by the gated D latch, a data signal on a data port and a reset signal on a reset port (403); generating, by the gated D latch, the pumping signal as an output (404); generating, by respective delay circuits, the sequentially delayed versions of the pumping signal (405); receiving, by an inverter, an input comprising the delayed version of the pumping signal provided to a last of other pump units in the plurality of pump units (406); generating, by the inverter, an output (407); and providing the output of the inverter as the data signal to the latch (408).

It should be noted that, as used herein, the terms "over" and "on" both inclusively include "directly on" (no intermediate materials, elements or space disposed therebetween) and "indirectly on" (intermediate materials, elements or space disposed therebetween. For example, forming an element "over a substrate" can include forming the element directly on the substrate with no intermediate materials/elements therebetween, as well as forming the element indirectly on the substrate with one or more intermediate materials/elements there between.

What is claimed is:

1. A system comprising:
   a plurality of charge pump units connected in parallel to receive an input voltage and to generate an output voltage greater than the input voltage; and
   a pumping controller to provide a pumping signal to a first charge pump unit of the plurality of charge pump units and to provide sequentially delayed versions of the pumping signal to the other charge pump units of the plurality of charge pump units,
   wherein the pumping controller comprises:
   a voltage divider to receive the output voltage and generate a lower voltage at a node, the voltage divider comprising a first resistor coupled to a second resistor at the node, wherein the first resistor receives the output voltage; and
   a capacitor coupled between the output voltage and the node.

2. The system of claim 1, wherein the pumping controller comprises:
   a comparator comprising a first input coupled to the node, a second input coupled to a reference voltage, and an output.

3. The system of claim 2, wherein the pumping controller comprises:
   a latch to generate a latch output in response to the output from the comparator received on a latch enable port, a data signal received on a data port, and a reset signal received on a reset port.

4. The system of claim 3, wherein the latch output is provided as the pumping signal to the first pump unit of the plurality of pump units.

5. The system of claim 4, wherein the pumping controller comprises:
   delay circuits to generate the sequentially delayed versions of the pumping signal.

6. The system of claim 5, wherein the pumping controller comprises:
   an inverter to receive as an input the delayed version of the pumping signal provided to a last pump unit of the other pump units of the plurality of pump units and to generate an output;
   wherein the output of the inverter is provided to the latch as the data signal.

7. A method comprising:
   receiving, by a plurality of charge pump units connected in parallel, an input voltage;
   providing a pumping signal to a first pump unit in the plurality of charge pump units;
   providing sequentially delayed versions of the pumping signal to the other charge pump units in the plurality of charge pump units;
   generating, by the plurality of charge pump units, an output voltage greater than the input voltage;
   comparing a voltage proportional to the output voltage to a reference voltage to generate a comparator output;
   receiving, by a gated D latch with a reset port, the comparator output on a latch enable port;
   receiving, by the latch, a data signal on a data port and a reset signal on a reset port; and
   generating, by the latch, the pumping signal as an output.

8. The method of claim 7, comprising:
generating, by respective delay circuits, the sequentially delayed versions of the pumping signal.

9. The method of claim 8, comprising:
receiving, by an inverter, an input comprising the delayed version of the pumping signal provided to a last of other pump units in the plurality of pump units; and
generating, by the inverter, an output.

10. The method of claim 9, comprising:
providing the output of the inverter as the data signal to the latch.

11. A system comprising:
a voltage regulator to generate a pumping signal for a first pump unit in a plurality of pump units connected in parallel, and to generate sequentially delayed versions of the pumping signal for other pump units in the plurality of pump units;
a voltage divider to receive an output voltage from the plurality of pump units and generate a voltage proportional to the output voltage at a node, the voltage divider comprising a first resistor coupled to a second resistor at the node, and wherein the first resistor receives the output voltage; and
a capacitor comprising a first plate receiving the output voltage and a second plate coupled to the node.

12. The system of claim 11, comprising:
a comparator comprising a first input coupled to the node, a second input coupled to a reference voltage, and an output.

13. The system of claim 12, comprising:
a latch to generate a latch output in response to the output from the comparator received on a latch enable port, a data signal received on a data port, and a reset signal received on a reset port.

14. The system of claim 13, wherein the latch output is provided as the pumping signal.

15. The system of claim 14, comprising:
delay circuits to generate the sequentially delayed versions of the pumping signal.

16. The system of claim 15, comprising:
an inverter to receive as an input a last version of the sequentially delayed versions of the pumping signal and to generate an output provided to the latch as the data signal.

* * * * *